(12) United States Patent
Komatsu (10) Patent No.: US 7,825,725 B2
(45) Date of Patent: Nov. 2, 2010

(54) CLASS D AMPLIFIER

(75) Inventor: Terumitsu Komatsu, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 85 days.

(21) Appl. No.: 12/219,349

(22) Filed: Jul. 21, 2008

(65) Prior Publication Data

US 2009/0021305 A1   Jan. 22, 2009

(30) Foreign Application Priority Data

Jul. 20, 2007   (JP) .............................. 2007-189768

(51) Int. Cl.
  *H03F 3/38*   (2006.01)
  *H03F 3/217*  (2006.01)
(52) U.S. Cl. ..................... 330/10; 330/207 A
(58) Field of Classification Search .............. 330/10, 330/207 A, 251
  See application file for complete search history.

(56) References Cited

U.S. PATENT DOCUMENTS

| 6,262,632 | B1  | 7/2001  | Corsi et al. |
| 6,788,137 | B2* | 9/2004  | Morita .................... 330/10 |
| 7,312,657 | B2  | 12/2007 | Kurokawa |
| 7,538,611 | B2* | 5/2009  | Chen et al. .............. 330/251 |
| 2005/0231280 | A1 | 10/2005 | Kurokawa |

FOREIGN PATENT DOCUMENTS

JP   2005-303814   10/2005

* cited by examiner

*Primary Examiner*—Steven J Mottola
(74) *Attorney, Agent, or Firm*—McGinn IP Law Group, PLLC (57) ABSTRACT

Class D amplifier is resistant to interferences. Binary output signals y1 and y2, are generated from input signal s1, delivered to input terminal IN, to drive a load connected across output terminals OUTP and OUTN. Pulse generating circuit 10 generates a pulse width modulated pulse signal y0 from input signal s1, inverted signal of the output signal y1 and output signal y2. Differential pulse generating circuit 14 receives pulse signal y0 and inverts low and high levels of pulse signal y0, while shifting the resulting signal by half period from the pulse signal y0, to generate a pulse signal y3. Pulse amplifier 11a receives pulse signal y0 and generates output signal y1 supplied to output terminal OUTP. Pulse amplifier 11b receives pulse signal y3 and generates output signal y2 delivered to output terminal OUTN.

20 Claims, 9 Drawing Sheets

CLASS D AMPLIFIER

REFERENCE TO RELATED APPLICATION

This application is based upon and claims the benefit of the priority of Japanese patent application No. 2007-189768 filed on Jul. 20, 2007, the disclosure of which is incorporated herein in its entirety by reference thereto.

TECHNICAL FIELD

This invention relates to a class D amplifier. More particularly, it relates to an amplifier by pulse width modulation (PWM) for driving a load, such as a coil.

BACKGROUND

The class D amplifier is an amplifier for power amplification by pulse width modulation of an input signal. It is extensively used as an audio amplifier for a mobile phone, for instance. This class D amplifier compares an input analog signal and its differential signal to a ramp carrier wave signal to deliver pulse-width-modulated positive-phase and negative-phase output pulse signals. As compared to a linear amplifier, the class D amplifier is featured by low power consumption because an output pulse signal may be driven by the pulsed voltage of low saturation.

Figure 7:
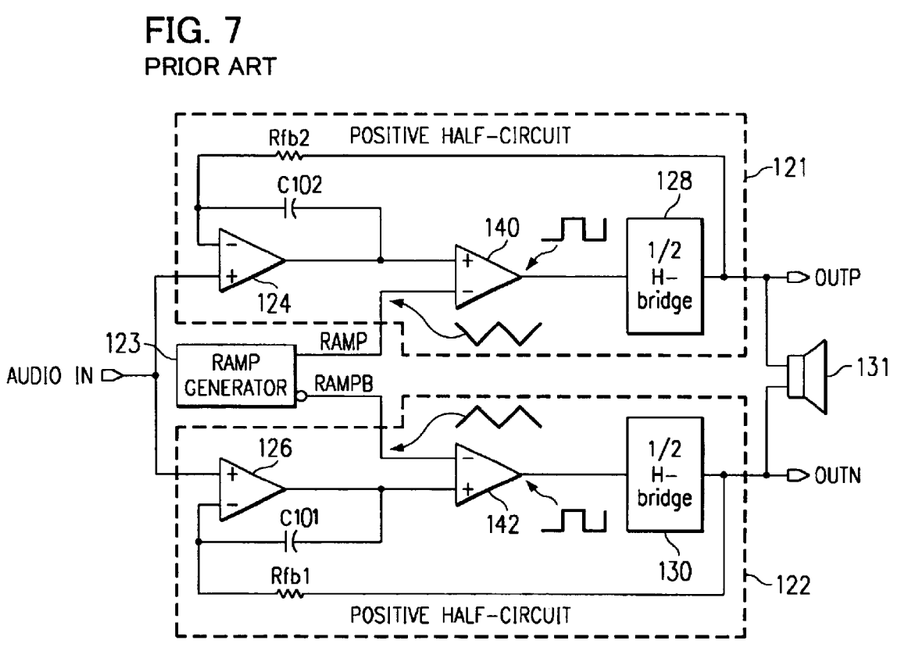
FIG. 7 is a block diagram showing the formulation of a class D amplifier disclosed in Patent Document 1.

The class D amplifier is disclosed in Patent Documents 1 and 2, for instance. FIG. 7 depicts a block diagram showing a formulation of a class D amplifier disclosed in Patent Document 1. In FIG. 7, a comparator for voltage feedback 140 compares a differential output signal of an integrating amplifier 124 to a ramp signal RAMP generated by a ramp signal generator 123. The differential output signal of the integrating amplifier 124 is obtained from a feedback signal as later described and an AUDIO IN input. A comparator for voltage feedback 142 compares a differential output signal of an integrating amplifier 126 to an inverted ramp signal RAMPB generated by the ramp signal generator 123. The differential output signal of the integrating amplifier 126 is obtained from another feedback signal as later described and the AUDIO IN input. The pulse width modulated pulse signal, representing the result of comparison by the comparator for voltage feedback 140, is amplified by a half bridge 128 and delivered to an output terminal OUTP. The pulse width modulated pulse signal, representing the result of comparison by the comparator for voltage feedback 142, is amplified by a half bridge 130 and delivered to an output terminal OUTN. A load 131 is connected across the output terminals OUTP and OUTN. The output terminal OUTP is connected to the integrating amplifier 124 via a resistor Rfb2 as a feedback path. A capacitor C102 is connected across the input and the output of the integrating amplifier 124. The output terminal OUTN is connected to the integrating amplifier 126 via a resistor Rfb1 as a feedback path. A capacitor C101 is connected across the input and the output of the integrating amplifier 126. The class D amplifier, formulated as described above, delivers a positive phase output pulse signal and a negative phase output pulse signal, pulse width modulated by a positive side circuit 121 and a negative side circuit 122, respectively, to either ends of the load 131.

Figure 8:
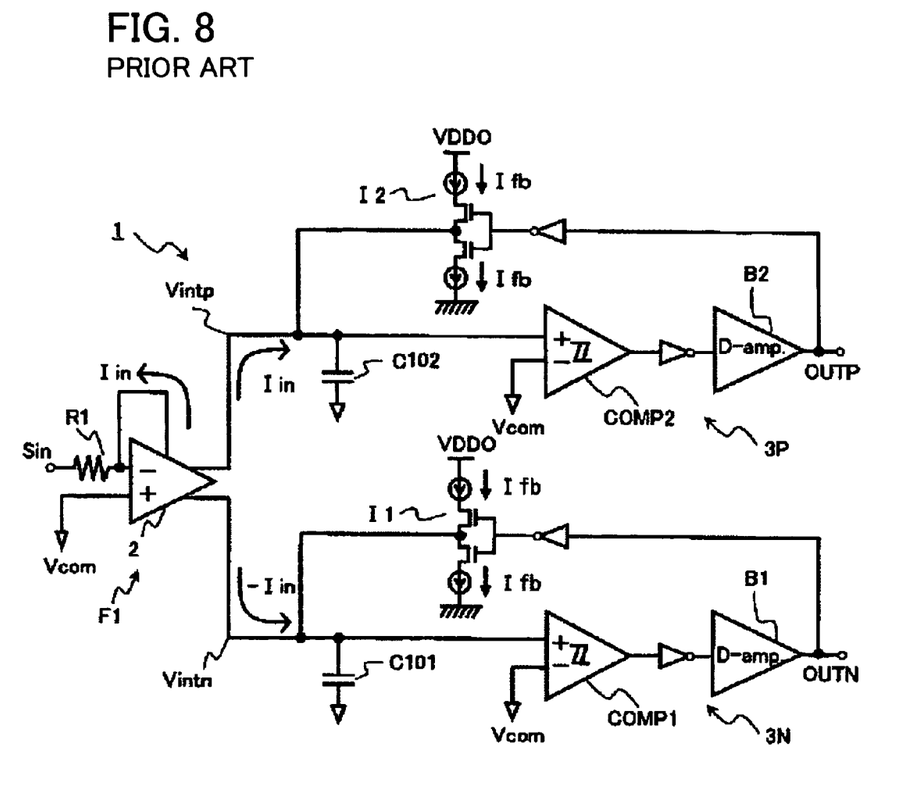
FIG. 8 is a block diagram showing the formulation of a class D amplifier disclosed in Patent Document 2

FIG. 8 depicts a block diagram showing the constitution of a class D amplifier disclosed in Patent Document 2. In FIG. 8, the class D amplifier includes a voltage-controlled current source circuit F1 for converting an input voice voltage signal Sin to two currents of different polarities, and capacitive elements for integration C101, C102 in which charges of the signals converted to currents and charges of the feedback currents are stored. The class D amplifier also includes hysteresis comparators COMP1, COMP2 for conversion by PWM, and output buffers B1, B2 for amplifying outputs of the hysteresis comparators. These hysteresis comparators compare the potentials of the capacitive elements for integration C101, C102 to a reference voltage Vcom. The class D amplifier further includes output buffers B1 and B2 for amplifying the outputs of the hysteresis comparators and constant current source feedback circuits I1, I2 for feeding back the outputs of the output buffers B1 and B2, respectively.

The input signal Sin is converted to differential currents, inverted in polarity, and the feedback currents Ifb are added to the current of a current oscillator 2 by capacitors C1 and C2, and the resulting currents are compared to the reference voltage Vcom. By so doing, the pulse width modulated pulse signals are delivered to output terminals OUTP, OUTN. In the circuit constitution of FIG. 8, the current of the current oscillator is used to form a carrier, instead of using a ramp carrier signal. It should be noted that combining the difference between the differential currents and the carrier pulse currents by the capacitors and comparing the resulting currents with the reference voltage Vcom yields an effect similar to comparing the differential voltage with the ramp carrier voltage.

[Patent Document 1] U.S. Pat. No. 6,262,632
[Patent Document 2] JP Patent Kokai Publication No. JP-P2005-303814A

SUMMARY OF THE DISCLOSURE

The entire disclosures of Patent Documents 1 and 2 are incorporated herein by reference thereto.

The following analysis has been given according to the present invention.

Figure 9:
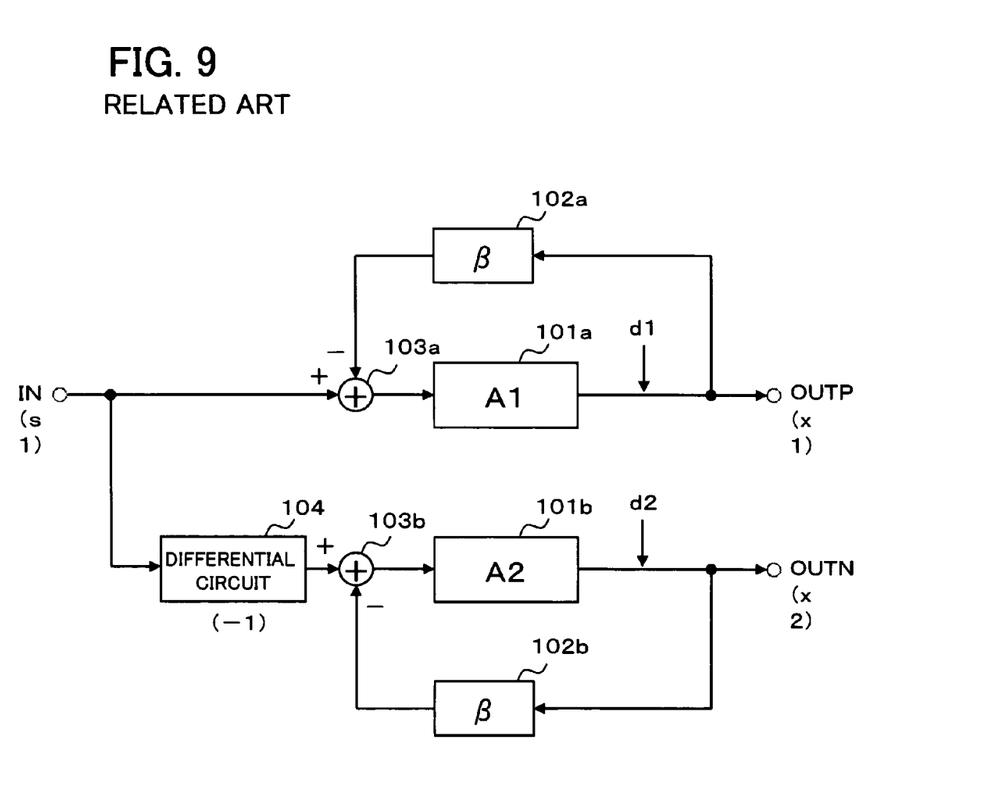
FIG. 9 is a block diagram for illustrating the operation for amplification in a conventional class D amplifier.

FIG. 9 depicts a block diagram for illustrating the operation for amplification by conventional class D amplifiers disclosed in Patent Documents 1 and 2. Referring to FIG. 9, an output signal x1 and an output signal x2, as binary signals, are generated from an input signal s1, delivered to an input terminal IN, for driving a load connected across output terminals OUTP and OUTN. The output signal x1 is obtained by amplifying, by an amplifier 101a with a gain A1, the difference between the input signal s1 and the output signal x1 itself fed back via a coefficient unit 102a with a coefficient $\beta$. The output signal x2 is obtained by amplifying, by an amplifier 101b with a gain A2, the difference between an inverted version of the input signal s1 and the output signal x2 itself fed back via a coefficient unit 102b with a coefficient $\beta$. It should be noted that the inverted version of the input signal s1 is a signal corresponding to the input signal multiplied with a gain −1 by a differential circuit 104, and that the amplifiers 101a and 101b are equivalent to circuits each made up of an integrator and a comparator.

It is now assumed that noise signals d1, d2 are mixed into outputs of the amplifiers 101a, 101b, respectively. Under these conditions, the following equations are valid:

$$x1 = A1(s - \beta \cdot x1) + d1$$

$$x2 = A2(-s - \beta \cdot x2) + d2$$

Therefore, $$x1 - x2 = A1 \cdot s/(1 + A1 \cdot \beta) + A2 \cdot s/(1 + A2 \cdot \beta) + d1/(1 + A1 \cdot \beta) - d2/(1 + A2\beta)$$

It should be noted that the amplifiers 101a and 101b are formed by respective different integrators and comparators, and hence it is not possible to make A1 accurately equal to A2.

Thus, even in case the noises d1 and d2, such as power supply noise or the ground noise, are in phase with and equal in magnitude to each other, a noise signal is output in the load supplied with x1−x2, and hence a strong resistance against interference may not be obtained. Accordingly, there is much to be desired in the art.

In one aspect, the present invention provides a class D amplifier in which first and second output signals, as binary signals, are generated from an input signal, to drive a load connected across first and second output terminals. The class D amplifier comprises a pulse generating circuit that generates a pulse width modulated first pulse signal from the input signal, an inverted signal of the first output signal and the second output signal, and a differential pulse generating circuit that receives the first pulse signal and that generates a second pulse signal by inverting the low level and the high level of the first pulse signal and by shifting the resulting pulse signal by a half period of the first pulse signal. The class D amplifier also comprises a first pulse amplifier that receives the first pulse signal to generate the first output signal to deliver the generated first output signal to the first output terminal, and a second pulse amplifier that receives the second pulse signal to generate the second output signal to deliver the generated second output signal to the second output terminal.

The meritorious effects of the present invention are summarized as follows.

According to the present invention, the pulse generating circuit that determines the gain of the class D amplifier is used in common for first and second output signals. Thus, in case noise signals, which are in phase with each other and of the same amplitude, are superimposed in the first and second pulse amplifiers, no noise signal is output to the load, thus providing strong resistance against interferences.

PREFERRED MODES OF THE INVENTION

Figure 1:
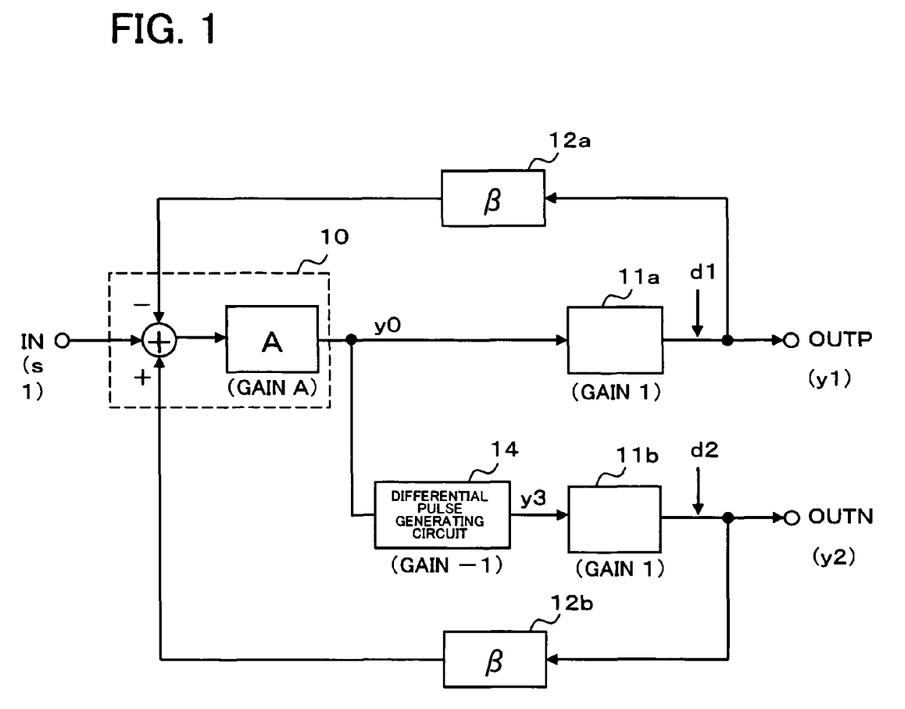
FIG. 1 is a block diagram for illustrating the operation for amplification in a class D amplifier according to an exemplary embodiment of the present invention.

FIG. 1 depicts a block diagram for illustrating the operation for amplification with the class D amplifier according to an exemplary embodiment of the present invention. Referring to FIG. 1, the class D amplifier generates an output signal y1 and an output signal y2, both of which are binary signals, from an input signal s1, delivered to an input terminal IN, to drive a load connected across an output terminal (first output terminal) OUTP and an output terminal (second output terminal) OUTN. The output signal y1 is a first output signal or a (+) side output signal, and the output signal y2 is a second output signal or a (−) side output signal. A pulse generating circuit 10 generates a pulse width modulated pulse signal (first pulse signal) y0 from the input signal s1, an inverted signal of the output signal y1 and the output signal y2. A differential pulse generating circuit 14 receives the pulse signal y0 and inverts the low and high levels of the pulse signal y0, while shifting the resulting signal by a half period from the pulse signal y0, to generate a pulse signal (second pulse signal) y3 corresponding to the pulse signal y0 which has the high and low levels inverted and which has been shifted by the half period from the pulse signal y0. A pulse amplifier (first pulse amplifier) 11a receives the pulse signal y0 and generates the output signal y1 which is then supplied to the output terminal OUTP. A pulse amplifier (second amplifier) 11b receives the pulse signal y3 and generates the output signal y2 which is delivered to the output terminal OUTN.

In the above-described class D amplifier, the pulse generator 10 may be deemed to be a circuit for finding a sum of the input signal s1, a signal corresponding to the output signal y1 fed back via a coefficient unit 12a with a coefficient β, and a signal corresponding to the output signal y2 fed back via a coefficient unit 12b with a coefficient β, and for amplifying the resulting signal with a gain A to yield the signal y0. The differential pulse generating circuit 14 simply inverts a signal without changing its duty ratio and hence may be deemed to be a circuit having a gain of −1. On the other hand, the pulse amplifies 11a, 11b do not change the duty ratio of the signal, and hence may be deemed to be a circuit having a gain of 1. It is now assumed that noise signals d1 and d2 are mixed to outputs of the pulse amplifies 11a, 11b, respectively. Under these assumptions, the following equations are established:

$$y1 = A(s - \beta \cdot y1 + \beta \cdot y2) + d1$$

$$y2 = -A(s - \beta \cdot y1 + \beta \cdot y2) + d2$$

Therefore, $y1 - y2 = 2A \cdot s + d1 - d2 - 2A \cdot \beta(y1 - y2)$

Therefore, $y1 - y2 = 2A \cdot s/(1 + 2A \cdot \beta) + (d1 - d2)/(1 + 2A \cdot \beta)$ It is seen from the above equations that, in case the noise signals d1 and d2 are in phase with each other and of the same amplitude, no noise signal is delivered as an output in the load supplied with y1−y2, thus providing for strong resistance against interferences.

In the class D amplifier according to an exemplary embodiment of the present invention, the pulse generating circuit preferably includes a current supplying circuit, a first capacitive device and a first comparator. The current supplying circuit generates a first current corresponding to the input signal, a second signal which is positive or negative in meeting with the level of an inverted signal of the first output signal, a third current which is positive or negative in meeting with the level of the second output signal, and a fourth current which is positive or negative in meeting with the level of a rectangular-shaped signal. The first capacitive device is charged and discharged by each of the first, second, third and fourth signals. The first comparator compares the voltage of the first capacitive device to a reference voltage to output the result of comparison as the first pulse signal.

Preferably, the differential pulse generating circuit renders a time interval during which the first pulse signal is at a first level a time interval during which the second pulse signal is at a second level in the next period, while rendering a time interval during which the first pulse signal is at a second level a time interval during which the second pulse signal is at a first level in the next period.

Preferably, the differential pulse generating circuit includes second and third capacitive devices, a first charging/discharging circuit for charging and discharging the second capacitive device with a constant current; a second charging/discharging circuit for charging and discharging the third capacitive device with another constant current, a second comparator for comparing the voltage of the second capacitive device to a first preset voltage; a third comparator for comparing the voltage of the third capacitive device to a second preset voltage; and a control circuit for controlling the first and second charging/discharging circuits to generate a second pulse signal based on the result of comparison by the second and third comparators. Preferably, the control circuit provides operations including: setting the voltage of the second capacitive device at the first preset voltage; causing the second capacitive device to start charging or discharging at a first edge of a rectangular-shaped signal; halting the charging or discharging of the second capacitive device with level transition of the first pulse signal; causing the second capacitive device to start charging or discharging at a second edge of the rectangular-shaped signal opposite in direction to the first edge; and causing transition of the second pulse signal from a first level to a second level at a timing when the voltage of the second capacitive device is coincident with the first preset voltage.

Also preferably, the control circuit provides operations including: setting the voltage of the third capacitive device at the second preset voltage; causing the third capacitive device to start charging or discharging at a second edge of the rectangular-shaped signal; halting the charging or discharging of the third capacitive device with level transition of the first pulse signal; causing the third capacitive device to start charging or discharging at the first edge of the rectangular-shaped signal; and causing transition of the second pulse signal from the second level to the first level at a timing when the voltage of the third capacitive device is coincident with the second preset voltage.

Preferably, the differential pulse generating circuit includes second and third capacitive devices; a first charging/discharging circuit for charging and discharging the second capacitive device with a constant current; a second charging/discharging circuit for charging and discharging the third capacitive device at another constant current; a comparator for comparing the voltage of the second capacitive device or the voltage of the third capacitive device to a preset voltage, a selection circuit for selecting the voltage of the second capacitive device or the voltage of the third capacitive device to deliver the selected voltage to the comparator, and a control circuit for controlling the first charging/discharging circuit or the second charging/discharging circuit to generate the second pulse signal based on the result of comparison by the comparator.

Preferably, the control circuit provides operations comprising: setting the voltage of the second capacitive device at the first preset voltage; causing the second capacitive device to start charging or discharging at a first edge of the rectangular-shaped signal; halting the charging or discharging of the second capacitive device with level transition of the first pulse signal; controlling the selection circuit to cause the second capacitive device to start charging or discharging at a second edge of the rectangular-shaped signal opposite in direction to the first edge, and to select the second capacitive device; and causing transition of the second pulse signal from a first level to a second level at a timing when the voltage of the second capacitive device is coincident with the first preset voltage.

Also preferably, the control circuit provides operations comprising: setting the voltage of the third capacitive device at the preset voltage; causing the third capacitive device to start charging or discharging at a second edge of the rectangular-shaped signal; halting the charging or discharging of the third capacitive device with level transition of the first pulse signal; controlling the selection circuit to cause the third capacitive device to start charging or discharging at the first edge of the rectangular-shaped signal, and to select the voltage of the third capacitive device; and causing transition of the second pulse signal from the second level to the first level at a timing when the voltage of the third capacitive device is coincident with the second preset voltage.

Preferred examples of the present invention will now be described with reference to the drawings.

EXAMPLE 1

Figure 2:
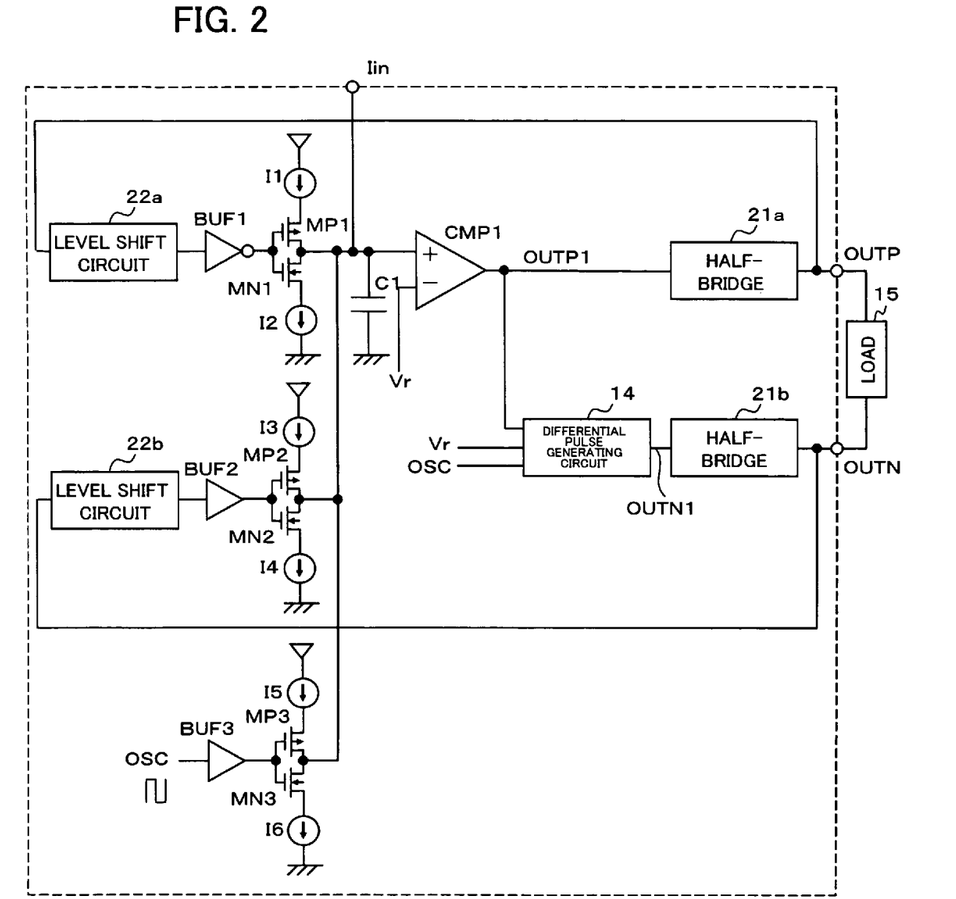
FIG. 2 is a block diagram showing the constitution of a class D amplifier according to a first example of the present invention.

FIG. 2 depicts a block diagram showing the constitution of a class D amplifier according to a first example of the present invention. The class D amplifier, shown in FIG. 2, includes an input terminal Iin, output terminals OUTP, OUTN, current source circuits I1 to I6, Nch transistors MN1 to MN3, Pch transistors MP1 to MP3, buffer circuits BUF1 to BUF3, level shift circuits 22a, 22b, a capacitive device C1, a comparator CMP1, a differential pulse generating circuit 14 and half bridges 21a, 21b.

The input terminal Iin is connected to one end of the capacitive device C1, the other end of which is grounded, and to the non-inverting input terminal (+) of the comparator CMP1.

The comparator CMP1 compares a voltage at one end of the capacitive device C1 to a reference voltage Vr at the inverting input terminal (−) thereof to deliver a pulse signal OUTP1, which is the result of the comparison, to the half bridge 21a and to the differential pulse generating circuit 14.

The differential pulse generating circuit 14 receives a rectangular-shaped signal OSC, a reference voltage Vr and the pulse signal OUTP1, and generates a pulse signal OUTN1 by inverting the low and high levels of the pulse signal OUTP1 and shifting the resulting signal by a half period of the pulse signal OUTP1. That is, the time interval during which the pulse signal OUTP1 is at H level is made to be a time interval of the L level of the next period of the pulse signal OUTN1, and the time interval during which the pulse signal OUTP1 is at L level is made to be a time interval of the H level of the next period of the pulse signal OUTN1.

The half-bridge 21a amplifies the pulse signal OUTP1, without changing its duty ratio, and delivers the so amplified signal to the output terminal OUTP. The half-bridge 21b amplifies the pulse signal OUTN1, without changing its duty ratio, and delivers the so amplified signal to the output terminal OUTN. A load 15 is connected across the output terminals OUTP and OUTN.

The output terminal OUTP is connected via the level shift circuit 22a and the buffer circuit BUF1, having an inverting capability, to the gates of the Nch transistor MN1 and the Pch transistor MP1.

The Pch transistor MP1 has its source connected via the current source circuit I1 to a power supply, while having its drain connected to one end of the capacitive device C1. The Nch transistor MN1 has its source grounded via the current source circuit I2, while having its drain connected to the one end of the capacitive device C1. The supply currents by the current source circuits I1 and I2 are equal to each other. That is, the charging current to the capacitive device C1 by the current source circuit I1 when the Pch transistor MP1 is on is equal in magnitude to the discharging current to the capacitive device C1 by the current source circuit I2 when the Nch transistor MN1 is on.

The output terminal OUTN is connected via the level shift circuit 22b and the buffer circuit BUF2 to the gates of the Nch transistor MN2 and the Pch transistor MP2.

The Pch transistor MP2 has a source connected via the current source circuit I3 to a power supply, while having a drain connected to one end of the capacitive device C1. The Nch transistor MN2 has a source grounded via the current source circuit I4, while having a drain connected to one end of the capacitive device C1. The supply currents by the current source circuits I3 and I4 are equal to each other. That is, the charging current to the capacitive device C1 by the current source circuit I3 when the Pch transistor MP2 is on is equal to the discharging current to the capacitive device C1 from the current source circuit I4 when the Nch transistor MN2 is on. Moreover, the supply currents by the current source circuits I3 and I4 are equal to the supply currents by the current source circuits I1 and I2.

A rectangular-shaped signal OSC is supplied via the buffer circuit BUF3 to the gates of the Nch transistor MN3 and the Pch transistor MP3.

The Pch transistor MP3 has a source connected via the current source circuit I5 to the power supply, while having a drain connected to the one end of the capacitive device C1. The Nch transistor MN3 has a source grounded via the current source circuit I6, while having a drain connected to the one end of the capacitive device C1. The supply currents by the current source circuits I5 and I6 are equal to each other. That is, the charging current to the capacitive device C1 by the current source circuit I5 when the Pch transistor MP3 is on is equal to the discharging current to the capacitive device C1 from the current source circuit I6 when the Nch transistor MN3 is on.

In the above-described class D amplifier, the circuit formulated by the level shift circuit 22a, buffer circuit BUF1, Pch transistor MP1, current source circuit I1, Nch transistor MN1 and the current source circuit I2 is equivalent to the coefficient unit 12a which is a feedback circuit in FIG. 1. The value of the supply currents by the current source circuits I1 and I2 corresponds to the amount of feedback β. However, the current value is to be multiplied by −1 to take account of inversion. In addition, the circuit formulated by the level shift circuit 22b, buffer circuit BUF2, Pch transistor MP2, current source circuit I3, Nch transistor MN2 and the current source circuit I4 is equivalent to the coefficient unit 12b which is a feedback circuit in FIG. 1. The value of the supply currents by the current source circuits I3 and I4 corresponds to the amount of feedback β.

At one end of the capacitive device C1, there is generated a triangular-shaped ramp signal by the charging/discharging currents to the capacitive device C1, from the current source circuits I5 and I6, in keeping with the H and L levels of the rectangular-shaped signal OSC, respectively. Also, the voltage at one end of the capacitive device C1 is varied (undulated) in response to the current corresponding to the input signal supplied to the input terminal Iin. That is, the voltage at one end of the capacitive device C1 is an input signal on which is overlaid the ramp signal and on which are further added the amounts of feedbacks β of the signals at the output terminals OUTP and OUTN.

The comparator CMP1 compares the voltage at one end of the capacitive device C1 to the reference voltage Vr to deliver the pulse width modulated pulse signal OUTP1 to the half-bridge 21a and to the differential pulse generating circuit 14. The differential pulse generating circuit 14 inverts the pulse signal OUTP1 and shifts its phase to form the pulse signal OUTN1 which is then delivered to the half-bridge 21b.

The pulse generating circuit 10 of FIG. 1 is formed by the current source circuits I1 to I6, capacitive device C1 and the comparator CMP1. The pulse signal OUTP1, delivered by the pulse generating circuit 10, is used in common by the positive side half-bridge 21a and the negative side half-bridge 21b.

Figure 3:
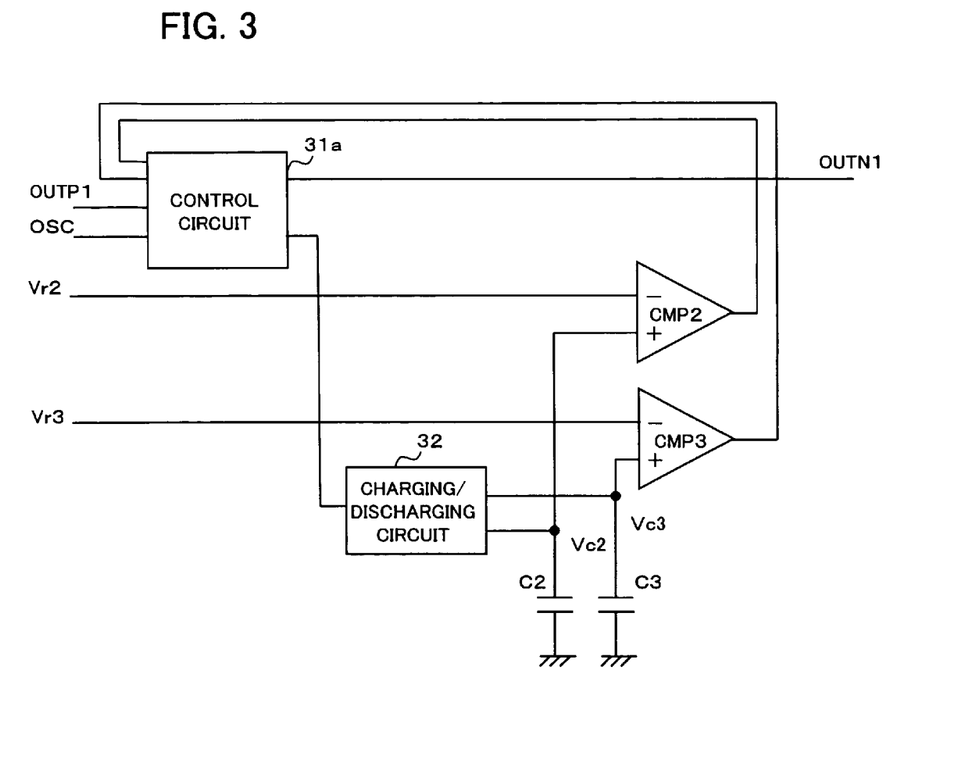
FIG. 3 is a block diagram showing the constitution of a differential pulse generating circuit of the first example of the present invention.

The differential pulse generating circuit 14 is now described in detail. FIG. 3 depicts a block diagram showing a formulation of the differential pulse generating circuit according to the first example of the present invention. In FIG. 3, the differential pulse generating circuit 14 includes a control circuit 31a, a charging/discharging circuit 32, capacitive devices C2, C3 and comparators CMP2, CMP3.

The control circuit 31a receives the pulse signal OUTP1, rectangular-shaped signal OSC and output signals of the comparators CMP2, CMP3, and controls the charging/discharging circuit 32 in keeping with the timings of these signals to output the pulse signal OUTN1.

The charging/discharging circuit 32 charges/discharges the capacitive devices C2, C3 under control from the control circuit 31a.

The comparator CMP2 compares charges accumulated in the capacitive device C2 to a reference voltage Vr2 to deliver the result of comparison to the control circuit 31a. The comparator CMP3 compares charges accumulated in the capacitive device C3 to a reference voltage Vr3 to deliver the result of comparison to the control circuit 31a.

Figure 4:
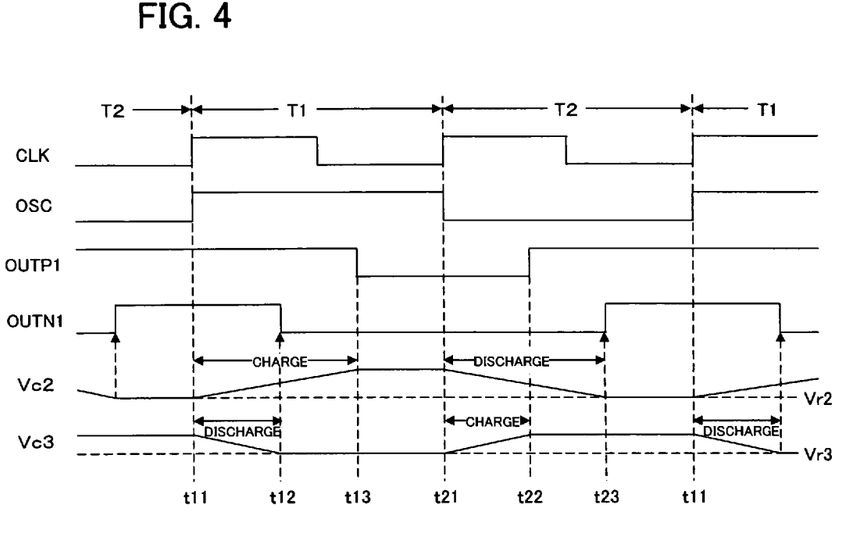
FIG. 4 is a timing chart for illustrating the operation of a differential pulse generating circuit according to the first example of the present invention.

FIG. 4 depicts a timing chart for illustrating the operation of the differential pulse generating circuit according to the first example of the present invention. In FIG. 4, the time period the rectangular-shaped signal OSC is at H level and the time period the rectangular-shaped signal OSC is at L level are labeled T1 and T2, respectively. It should be noted that the signal of the frequency equal to twice that of the rectangular-shaped signal OSC is shown as a clock signal CLK. The rectangular-shaped signal OSC is generated by ½ frequency division of the clock signal CLK.

At a rise time t11 of the rectangular-shaped signal OSC, the control circuit 31a controls the charging/discharging circuit 32 to start charging the capacitive device C2 and discharging the capacitive device C3.

When the control circuit 31a has given a decision that the voltage Vc3 of the capacitive device C3 has reached the reference voltage Vr3, at a timing t12, as verified from the result of comparison by the comparator CMP3, the control circuit 31a causes the charging/discharging circuit 32 to halt the discharging of the capacitive device C3. The control circuit also causes the pulse signal OUTN1 to fall down.

Now, assume that the pulse signal OUTP1 has fallen down at a timing t13. At this time, the control circuit 31a causes the charging/discharging circuit 32 to halt the charging of the capacitive device C2.

At a fall timing t21 of the rectangular-shaped signal OSC, the control circuit 31a controls the charging/discharging circuit 32 to start discharging of the capacitive device C2 and to start charging of the capacitive device C3.

Now, assume that the pulse signal OUTP1 has risen at a timing t22. At this time, the control circuit 31a causes the discharging circuit 32 to halt the charging of the capacitive device C3.

When the control circuit 31a has given a decision that the voltage Vc2 of the capacitive device C2 has reached the reference voltage Vr2, at a timing t23, as verified from the result of comparison by the comparator CMP2, the control circuit 31a causes the charging/discharging circuit 32 to halt the discharging of the capacitive device C2. At the same time, the control circuit also causes the pulse signal OUTN1 to rise.

The differential pulse generating circuit 14 operates in the manner as described above and makes a time interval between timing t21 and timing t22 equal to a time interval between timing t1 and timing t12, while making a time interval between timing t11 and timing t13 equal to a time interval between timing t21 and timing t23, to generate the pulse signal OUTN1. Here, now if it is assumed that the voltage Vc2 at the timing t11 is the reference voltage Vr2, and the charging and discharging currents of the capacitive device C2 are equal to each other, the time interval between timing t11 and timing t13 is equal in length to the time interval between timing t21 and timing t23. On the other hand, if it is assumed that the voltage Vc3 at the timing t21 is the reference voltage Vr3, and the charging and discharging currents of the capacitive device C3 are equal to each other, the time interval between timing t1 and timing t12 is equal in length to the time interval between timing t21 and timing t22.

It is thus possible with the differential pulse generating circuit 14 to render the time interval during which the pulse signal OUTP1 is at H level the L-level time interval of the next period of the pulse signal OUTN1, and to render the time interval during which the pulse signal OUTP1 is at L level the H-level time interval of the next period of the pulse signal OUTN1. In case the charging/discharging circuit 32 is in the current mirror configuration, it is possible to set the charging current so as to be equal to the discharging current to high accuracy with the use of a smaller number of devices. It is thus possible with the differential pulse generating circuit 14 to set the charging currents and the discharging currents in the capacitive devices to be equal to each other to deliver the pulse signal OUTN1 a duty ratio of which is an accurate inversion of that of the pulse signal OUTP1. Hence, the gain of the differential pulse generating circuit 14 may correctly be set to '−1'.

EXAMPLE 2

Figure 5:
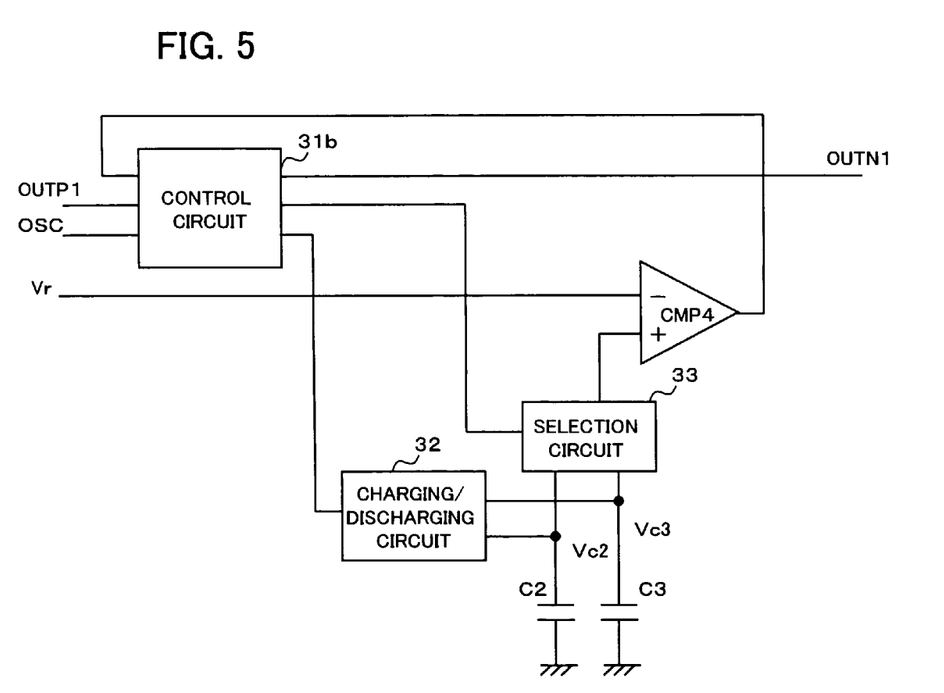
FIG. 5 is a block diagram showing a differential pulse generating circuit according to a second example of the present invention.

FIG. 5 depicts a block diagram showing a formulation of a differential pulse generating circuit according to a second example of the present invention. In FIG. 5, the same reference numerals or symbols as those used in FIG. 3 are used to depict the same components and the description of these components is dispensed with. The differential pulse generating circuit of FIG. 5 includes a selection circuit 33 and also includes a control circuit 31b in place of the control circuit 31a of FIG. 3. A common comparator CMP4 is used in place of the comparators CMP2, CMP3 of FIG. 3, and a common reference voltage Vr is used in place of the reference voltages Vr2, Vr3 of FIG. 3.

Figure 6:
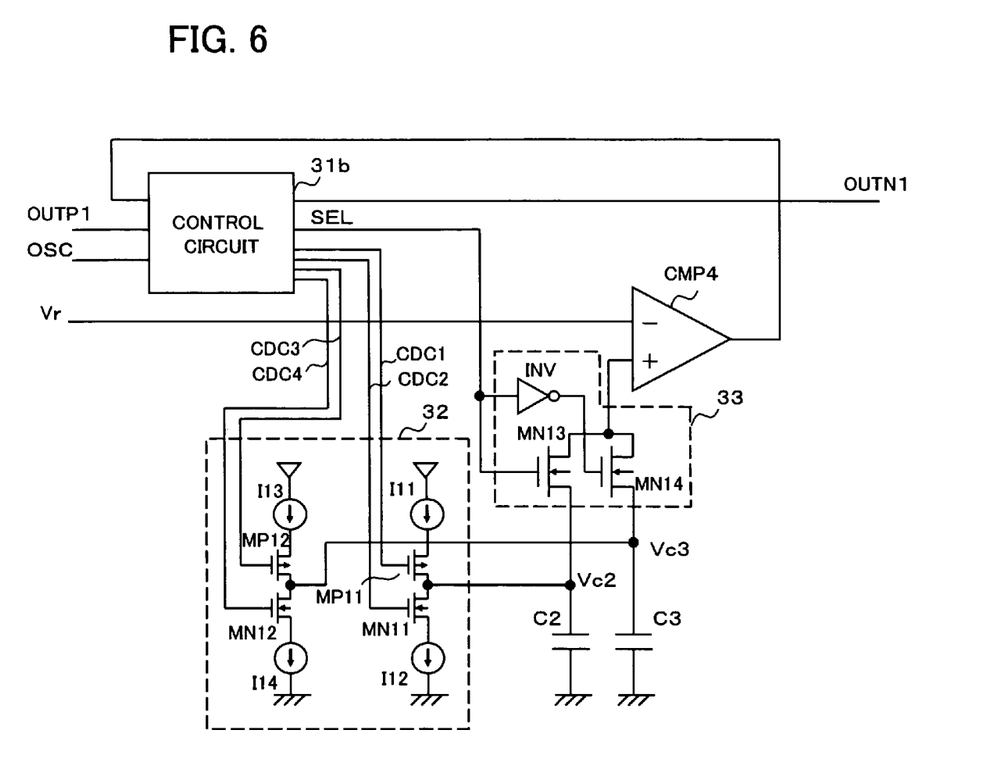
FIG. 6 is a circuit diagram showing details of a charging/discharging circuit and a selection circuit.

FIG. 6 depicts a circuit diagram showing the charging/discharging circuit 32 and the selection circuit 33. Referring to FIG. 6, the charging/discharging circuit 32 includes current source circuits I11 to I14, Nch transistors MN11, MN12 and Pch transistors MP11, MP12. The selection circuit 33 includes Nch transistors MN13, MN14 and an inverter circuit INV.

The control circuit 31b sets a signal CDC1 to L level during the time interval between timing t11 and timing t13 of FIG. 4 to turn on the Pch transistor MP11 to charge the capacitive device C2 by the current from the current source circuits I11.

The control circuit also sets a signal CDC2 to H level during the time interval between timing t21 and timing t23 of FIG. 4 to turn on the Pch transistor MN11 to discharge the capacitive device C2 by the current from the current source circuits I12.

The control circuit 31b sets a signal CDC3 to L level, during the time interval between timing t21 and timing t22 of FIG. 4, to turn on the Pch transistor MP12 to charge the capacitive device C3 by the current from the current source circuit I13. The control circuit 31b also sets a signal CDC4 to H level, during the time interval between timing t21 and timing t22 of FIG. 4, to turn on the Nch transistor MN12 to discharge the capacitive device C3 by the current from the current source circuit I14.

During the time interval T1 of FIG. 4, the control circuit 31b sets a signal SEL to L level and delivers it to the gate of the Nch transistor MN14 via the inverter circuit INV to turn on the Nch transistor MN14. The voltage Vc3 of the capacitive device C3 is supplied to the non-inverting terminal (+) of the comparator CMP4 by the Nch transistor MN14 which is now in an on-state.

During the time interval T2 of FIG. 4, the control circuit 31b sets a signal SEL to H level and delivers it to the gate of the Nch transistor MN13 to turn on the Nch transistor MN13. The voltage Vc2 of the capacitive device C2 is supplied to the non-inverting terminal (+) of the comparator CMP4 by the Nch transistor MN13 which is now in an on-state.

The differential pulse generating circuit, described above, operates in the same manner as in the first example described above.

With the present second example, the circuit formulation may be simplified by using the sole comparator based on switching with the selection circuit 33.

It should be noted that, in implementing the class D amplifier within an integrated circuit, in each of the first and second examples, the capacities of the capacitive devices C2, C3 should be large enough so as not to be affected by parasitic capacities of the analog switches or changeover switches for the constant current sources or by charge depletion due to leakage currents from the accumulated charges. However, the two timings necessary for generating the pulse signal OUTN1 as the differential pulse may be obtained with sufficient accuracy by setting the charge current of the capacitive device so as to be equal to its discharge current, such that it is unnecessary to maintain absolute capacity accuracy or relative capacity accuracy with respect to the other capacitive device.

Moreover, the two current sources, paired to each other for charging and discharging, may be configured as current mirror circuits, and hence the charging current may be made equal to the discharging current with the use of a smaller number of components. In addition, the analog switches may each be formed by a sole MOS transistor. Further, the control circuit may be formed by a logic circuit made up of 100 gates or so at most, and hence may be formed with a sufficiently small area. Conversely, with the conventional arrangement, a differential amplifier of a high accuracy is indispensable, with the result that a large area is needed for constructing the differential amplifier by one and the same process.

It should be noted that the level shift circuits 22a, 22b are here used for a possible case in which the power supply voltages of the half bridges 21a, 21b differ from the power supply voltages of the other blocks. However, if these power supply voltages are the same, the level shift circuits 22a, 22b may be dispensed with.

If the circuit formulation is such that the current values of the current source circuits I11 to I14 are varied in dependence upon the power supply voltages of the half bridges 21a, 21b, it is possible to improve the PSRR (Power Supply Rejection Ratio) performance.

The input terminal Iin is designed to receive the current as input. However, it may also receive the voltage as input, in which case it is necessary to add a current voltage converter at the input terminal Iin.

The disclosures of the above-listed Patent Documents are to be incorporated herein by reference thereto. The examples or examples can be changed or adjusted within the framework of the entire disclosures of the present invention, inclusive of the claims, based on the basic technical concept of the invention. Various combinations or selections of disclosed elements are also possible within the scope of the claims of the present invention. That is, the present invention naturally comprises various changes or corrections that may be made by those skilled in the art based on the entire disclosures, inclusive of claims, and on the technical concept of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A class D amplifier in which first and second output signals, as binary signals, are generated from an input signal, to drive a load connected across first and second output terminals, said class D amplifier comprising:
    a pulse generating circuit that generates a pulse width modulated first pulse signal from said input signal, an inverted signal of said first output signal, and said second output signal;
    a differential pulse generating circuit that receives said first pulse signal and that generates a second pulse signal by inverting a low level and a high level of said first pulse signal and shifting a resulting pulse signal by a half period of said first pulse signal;
    a first pulse amplifier that receives said first pulse signal to generate said first output signal to deliver the generated first output signal to said first output terminal; and
    a second pulse amplifier that receives said second pulse signal to generate said second output signal to deliver the generated second output signal to said second output terminal.

2. The class D amplifier according to claim 1, wherein said pulse generating circuit comprises:
    a current supplying circuit that receives a first current corresponding to said input signal and that supplies a second current which is positive or negative in accordance with a level of an inverted signal of said first output signal, a third current which is positive or negative in accordance with a level of said second output signal, and a fourth current which is positive or negative in accordance with a level of a rectangular-shaped signal;
    a first capacitive device charged and discharged by said first, second, third and fourth currents; and
    a first comparator that compares a voltage of said first capacitive device to a reference voltage to output a result of comparison as said first pulse signal.

3. The class D amplifier according to claim 1, wherein said differential pulse generating circuit renders a time interval during which said first pulse signal is at a first level a time interval during which said second pulse signal is at a second level in the next period; said differential pulse generating circuit rendering a time interval during which said first pulse signal is at a second level a time interval during which said second pulse signal is at a first level in the next period.

4. The class D amplifier according to claim 2, wherein said differential pulse generating circuit comprises:
    second and third capacitive devices;
    a first charging/discharging circuit that charges and discharges said second capacitive device with a constant current;
    a second charging/discharging circuit that charges and discharges said third capacitive device with another constant current;
    a second comparator that compares a voltage of said second capacitive device to a first preset voltage;
    a third comparator that compares a voltage of said third capacitive device to a second preset voltage; and
    a control circuit that controls said first and second charging/discharging circuits to generate said second pulse signal based on results of comparison by said second and third comparators,
    wherein said control circuit operates by:
        setting a voltage of said second capacitive device at said first preset voltage;
        causing said second capacitive device to start a charging or a discharging at a first edge of said rectangular-shaped signal;
        halting the charging or discharging of said second capacitive device with level transition of said first pulse signal;
        causing said second capacitive device to start a charging or a discharging at a second edge of said rectangular-shaped signal opposite in direction to said first edge; and
        causing a transition of said second pulse signal from a first level to a second level at a timing when the voltage of said second capacitive device is coincident with said first preset voltage;
    said control circuit further operating by:
        setting a voltage of said third capacitive device at said second preset voltage;
        causing said third capacitive device to start a charging or a discharging at a second edge of said rectangular-shaped signal;
        halting the charging or discharging of said third capacitive device with level transition of said first pulse signal;
        causing said third capacitive device to start a charging or a discharging at said first edge of said rectangular-shaped signal; and
        causing a transition of said second pulse signal from said second level to said first level at a timing when the voltage of said third capacitive device is coincident with said second preset voltage.

5. The class D amplifier according to claim 2, wherein said differential pulse generating circuit comprises:
    second and third capacitive devices;
    a first charging/discharging circuit that charges and discharges said second capacitive device with a constant current;
    a second charging/discharging circuit that charges and discharges said third capacitive device at another constant current;
    a comparator that compares a voltage of said second capacitive device or a voltage of said third capacitive device to a preset voltage;

a selection circuit that selects the voltage of said second capacitive device or the voltage of said third capacitive device to deliver a selected voltage to said comparator; and a control circuit that controls said first charging/discharging circuit or said second charging/discharging circuit to generate said second pulse signal based on a result of comparison by said comparator, wherein said control circuit operates by:
  setting the voltage of said second capacitive device at said first preset voltage;
  causing said second capacitive device to start a charging or a discharging at a first edge of said rectangular-shaped signal;
  halting the charging or discharging of said second capacitive device with a level transition of said first pulse signal;
  controlling said selection circuit to cause said second capacitive device to start a charging or a discharging at a second edge of said rectangular-shaped signal opposite in direction to said first edge, and to select a voltage of said second capacitive device; and
causing a transition of said second pulse signal from a first level to a second level at a timing when the voltage of said second capacitive device is coincident with said first preset voltage,
said control circuit further operating by:
  setting a voltage of said third capacitive device at said preset voltage;
  causing said third capacitive device to start a charging or a discharging at a second edge of said rectangular-shaped signal;
  halting the charging or discharging of said third capacitive device with a level transition of said first pulse signal;
  controlling said selection circuit to cause said third capacitive device to start a charging or a discharging at said first edge of said rectangular-shaped signal, and to select the voltage of said third capacitive device; and
  causing a transition of said second pulse signal from said second level to said first level at a timing when the voltage of said third capacitive device is coincident with said second preset voltage.

6. A class D amplifier, comprising:
an input terminal that receives an input signal;
first and second output terminals to which can be connected a load, said first and second output terminals thereby providing binary signals to said connected load, as based on said input signal;
a summing junction comprising a first capacitor; and
a first comparator comparing a voltage at said summing junction with a first reference voltage and providing a first comparator output signal that is used to generate said binary signals at said first and second output terminals,
wherein said summing junction sums currents from:
  said input signal;
  an inverted signal from said first output terminal;
  a non-inverted signal from said second output terminal; and
  a signal oscillator outputting a rectangular-shaped signal.

7. The class D amplifier of claim 6, further comprising a differential pulse generating circuit that receives said first comparator output signal and generates a signal provided to said second output terminal.

8. The class D amplifier of claim 7, said differential pulse generating circuit further receiving as inputs:
  a second reference voltage;
  a third reference voltage; and
  an output voltage from said signal oscillator.

9. The class D amplifier of claim 8, said differential pulse generating circuit comprising:
  a second capacitor;
  a third capacitor;
  a second comparator;
  a third comparator;
  a first charging/discharging circuit that charges and discharges said second capacitor with a first constant current; and
  a second charging/discharging circuit that charges and discharges said third capacitor with a second constant current,
  wherein said second comparator compares said second reference voltage to a voltage on said second capacitor and said third compares said third reference voltage to a voltage on said third capacitor.

10. The class D amplifier of claim 9, said differential pulse generating circuit further comprising a control circuit receiving as inputs:
  said first comparator output signal;
  an output from said second comparator;
  an output from said third comparator; and
  said output voltage from said signal oscillator.

11. The class D amplifier of claim 10, wherein said control circuit:
  sets the voltage of said second capacitor at a first preset voltage;
  causes said second capacitor to start a charging or a discharging at a first edge of said rectangular-shaped signal from said signal oscillator;
  halts the charging or discharging of said second capacitor device with a level transition of said first pulse signal;
  controls said selection circuit to cause said second capacitor to start a charging or a discharging at a second edge of said rectangular-shaped signal opposite in direction to said first edge, and to select a voltage of said second capacitive device; and
  causes a transition of said second pulse signal from a first level to a second level at a timing when the voltage of said second capacitive device is coincident with said first preset voltage,
  wherein said control circuit further:
    sets a voltage of said third capacitor to a preset voltage;
    causes said third capacitor to start a charging or a discharging at a second edge of said rectangular-shaped signal;
    halts the charging or discharging of said third capacitor with a level transition of said first pulse signal;
    controls said selection circuit to cause said third capacitor device to start a charging or a discharging at said first edge of said rectangular-shaped signal, and selects the voltage of said third capacitor; and
    causes a transition of said second pulse signal from said second level to said first level at a timing when the voltage of said third capacitive device is coincident with said second preset voltage.

12. The class D amplifier of claim 7, wherein said differential pulse generating circuit shifts a resulting pulse signal of said first pulse signal by a half period.

13. The class D amplifier of claim 7, wherein said differential pulse generating circuit renders a time interval during which said first pulse signal is at a first level a time interval during which said second pulse signal is at a second level in the next period; said differential pulse generating circuit rendering a time interval during which said first pulse signal is at a second level a time interval during which said second pulse signal is at a first level in the next period.

14. A class D amplifier, comprising:
  an input terminal that receives an input signal;
  first and second output terminals to which can be connected a load, said first and second output terminals thereby providing binary signals to said connected load, as based on said input signal; and
  a differential pulse generating circuit that shifts an output signal at said second output terminal by a half period relative to an output signal at said first output terminal, the shift ocurring after a pulse width modulation of the input signal.

15. The class D amplifier of claim 14, further comprising:
  a summing junction comprising a capacitor; and
  a first comparator comparing a voltage at said summing junction with a first reference voltage and providing a first comparator output signal that is used to generate said binary signals at said first and second output terminals,
  wherein said summing junction sums currents from:
    said input signal;
    an inverted signal from said first output terminal;
    a non-inverted signal from said second output terminal; and
    a signal oscillator outputting a rectangular-shaped signal.

16. The class D amplifier of claim 15, further comprising a differential pulse generating circuit that receives said first comparator output signal and generates a signal provided to said second output terminal.

17. The class D amplifier of claim 16, said differential pulse generating circuit further receiving as inputs:
  a second reference voltage;
  a third reference voltage; and
  an output voltage from said signal oscillator.

18. The class D amplifier of claim 17, said differential pulse generating circuit comprising:
  a second capacitor,
  a third capacitor;
  a second comparator;
  a third comparator;
  a first charging/discharging circuit that charges and discharges said second capacitor with a first constant current; and
  a second charging/discharging circuit that charges and discharges said third capacitor with a second constant current,
  wherein said second comparator compares said second reference voltage to a voltage on said second capacitor and said third compares said third reference voltage to a voltage on said third capacitor.

19. The class D amplifier of claim 18, said differential pulse generating circuit further comprising a control circuit receiving as inputs:
  said first comparator output signal;
  an output from said second comparator;
  an output from said third comparator; and
  said output voltage from said signal oscillator.

20. The class D amplifier of claim 19, wherein said control circuit:
  sets the voltage of said second capacitor at said first preset voltage;
  causes said second capacitor to start a charging or a discharging at a first edge of said rectangular-shaped signal from said signal oscillator;
  halts the charging or discharging of said second capacitor device with a level transition of said first pulse signal;
  controls said selection circuit to cause said second capacitor to start a charging or a discharging at a second edge of said rectangular-shaped signal opposite in direction to said first edge, and to select a voltage of said second capacitive device; and
  causes a transition of said second pulse signal from a first level to a second level at a timing when the voltage of said second capacitive device is coincident with said first preset voltage,
  wherein said control circuit further:
    sets a voltage of said third capacitor said preset voltage;
    causes said third capacitor to start a charging or a discharging at a second edge of said rectangular-shaped signal;
    halts the charging or discharging of said third capacitor with a level transition of said first pulse signal;
    controls said selection circuit to cause said third capacitor device to start a charging or a discharging at said first edge of said rectangular-shaped signal, and selects the voltage of said third capacitor; and
    causes a transition of said second pulse signal from said second level to said first level at a timing when the voltage of said third capacitive device is coincident with said second preset voltage.

* * * * *